US011432451B2

(12) United States Patent
Iwaki

(10) Patent No.: US 11,432,451 B2
(45) Date of Patent: Aug. 30, 2022

(54) WORK MACHINE AND MOUNTING METHOD

(71) Applicant: FUJI CORPORATION, Chiryu (JP)

(72) Inventor: Noriaki Iwaki, Hekinan (JP)

(73) Assignee: FUJI CORPORATION, Chiryu (JP)

(*) Notice: Subject to any disclaimer, the term of this patent is extended or adjusted under 35 U.S.C. 154(b) by 388 days.

(21) Appl. No.: 16/483,595

(22) PCT Filed: Mar. 3, 2017

(86) PCT No.: PCT/JP2017/008575
§ 371 (c)(1),
(2) Date: Aug. 5, 2019

(87) PCT Pub. No.: WO2018/158948
PCT Pub. Date: Sep. 7, 2018

(65) Prior Publication Data
US 2020/0008333 A1 Jan. 2, 2020

(51) Int. Cl.
*H05K 13/08* (2006.01)
*H05K 13/04* (2006.01)

(52) U.S. Cl.
CPC ..... *H05K 13/0815* (2018.08); *H05K 13/0419* (2018.08); *H05K 13/0426* (2013.01); *Y10T 29/49133* (2015.01)

(58) Field of Classification Search
CPC .. H05K 13/021; H05K 13/022; H05K 13/024; H05K 13/025; H05K 13/026;
(Continued)

(56) References Cited

U.S. PATENT DOCUMENTS

2005/0036274 A1* 2/2005 Suhara ............... H05K 13/0417
361/600
2017/0042073 A1 2/2017 Nagasawa et al.

FOREIGN PATENT DOCUMENTS

JP 5-198990 A 8/1993
JP 6-252013 A 9/1994
(Continued)

OTHER PUBLICATIONS

International Search Report dated May 23, 2017 in PCT/JP2017/008575 filed Mar. 3, 2017.

*Primary Examiner* — Peter Dungba Vo
*Assistant Examiner* — Joshua D Anderson
(74) *Attorney, Agent, or Firm* — Oblon, McClelland, Maier & Neustadt, L.L.P.

(57) ABSTRACT

A work machine including: a tape feeder with taped lead components having multiple leads to supply the lead components in a state of being detached from the taped components extended to a supply position; a mounting head to mount the lead components supplied by the tape feeder onto a board; an imaging device; and a control device having an imaging section to image an identification object, the identification object being on the taped components and capable of identifying the polarity of each of the multiple leads, and a determination section to determine whether an actual polarity disposition, which is the polarity disposition of each of the multiple leads, and a set polarity disposition, which is the polarity disposition of each of the multiple leads set in advance, match each other based on image data obtained by imaging with the imaging section.

3 Claims, 9 Drawing Sheets

(58) Field of Classification Search
CPC ............. H05K 13/029; H05K 13/0417; H05K 13/04196; H05K 13/0421; H05K 13/0426; H05K 13/0812; H05K 13/0813; H05K 13/0815; H05K 13/084; H05K 13/086; Y10T 29/49131; Y10T 29/49133; Y10T 29/49139; Y10T 29/53183
See application file for complete search history.

(56) References Cited

FOREIGN PATENT DOCUMENTS

| | | |
|---|---|---|
| JP | 2005-64423 A | 3/2005 |
| JP | 4403449 B2 | 1/2010 |
| JP | 4834703 B2 | 12/2011 |
| JP | 2017-34171 A | 2/2017 |

\* cited by examiner

WORK MACHINE AND MOUNTING METHOD

TECHNICAL FIELD

The present application relates to a work machine and a mounting method for mounting a lead component having multiple leads onto a board.

BACKGROUND ART

The multiple leads of the lead component have polarities as described in the following Patent Literature.

PATENT LITERATURE

Patent Literature 1: JP-A-5-198990

BRIEF SUMMARY

Technical Problem

An object of the present disclosure is to mount a lead component onto a board in a state where the polarity is correct.

Solution to Problem

In order to achieve the above-described object, the present specification discloses a work machine including: a tape feeder provided with taped components, consisting of taped lead components having multiple leads, in an extended manner and configured to supply the lead components in a state of being detached from the taped components extended to a supply position; a mounting head configured to mount the lead components supplied by the tape feeder onto a board; an imaging device; and a control device, the control device having an imaging section configured to image an identification object with the imaging device, the identification object being written on the taped components extended to the tape feeder and capable of identifying the polarity of each of the multiple leads, and a determination section configured to determine whether an actual polarity disposition, which is the polarity disposition of each of the multiple leads in the taped components extended to the tape feeder, and a set polarity disposition, which is the polarity disposition of each of the multiple leads set in advance, match each other based on image data obtained by imaging with the imaging section.

In order to achieve the above-described object, the present specification discloses a mounting method for mounting a lead component onto a board in a work machine including a tape feeder provided with taped components, consisting of taped lead components having multiple leads, in an extended manner and configured to supply the lead components in a state of being detached from the taped components extended to a supply position; a mounting head configured to mount the lead components supplied by the tape feeder onto a board; and an imaging device; the mounting method including: an imaging process of imaging an identification object with the imaging device, the identification object being written on the taped components extended to the tape feeder and capable of identifying the polarity of each of the multiple leads; a determining process of determining whether an actual polarity disposition, which is the polarity disposition of each of the multiple leads in the taped components extended to the tape feeder, and a set polarity disposition, which is the polarity disposition of each of the multiple leads set in advance, match each other based on image data obtained by imaging with the imaging process; and a mounting process of mounting the lead component, with the mounting head, onto the board with a set mounting angle which is a mounting angle set in advance in a case where it is determined by the determination section that the actual polarity disposition and the set polarity disposition match each other, and mounting the lead component, with the mounting head, onto the board with a mounting angle increased or decreased from the set mounting angle by the difference between the actual polarity disposition and the set polarity disposition in a case where it is determined in the determining process that the actual polarity disposition and the set polarity disposition do not match each other.

Advantageous Effects

According to the present disclosure, it is possible to determine whether the polarity disposition of multiple leads in taped components is correct in a state of extending to a tape feeder based on image data and mount the lead component onto a board in a state where the polarity is correct.

DESCRIPTION OF EMBODIMENTS

Hereinafter, embodiments of the present disclosure will be described as exemplary embodiments of the present disclosure in detail with reference to the drawings.

(A) Configuration of Component Mounter

Figure 1:
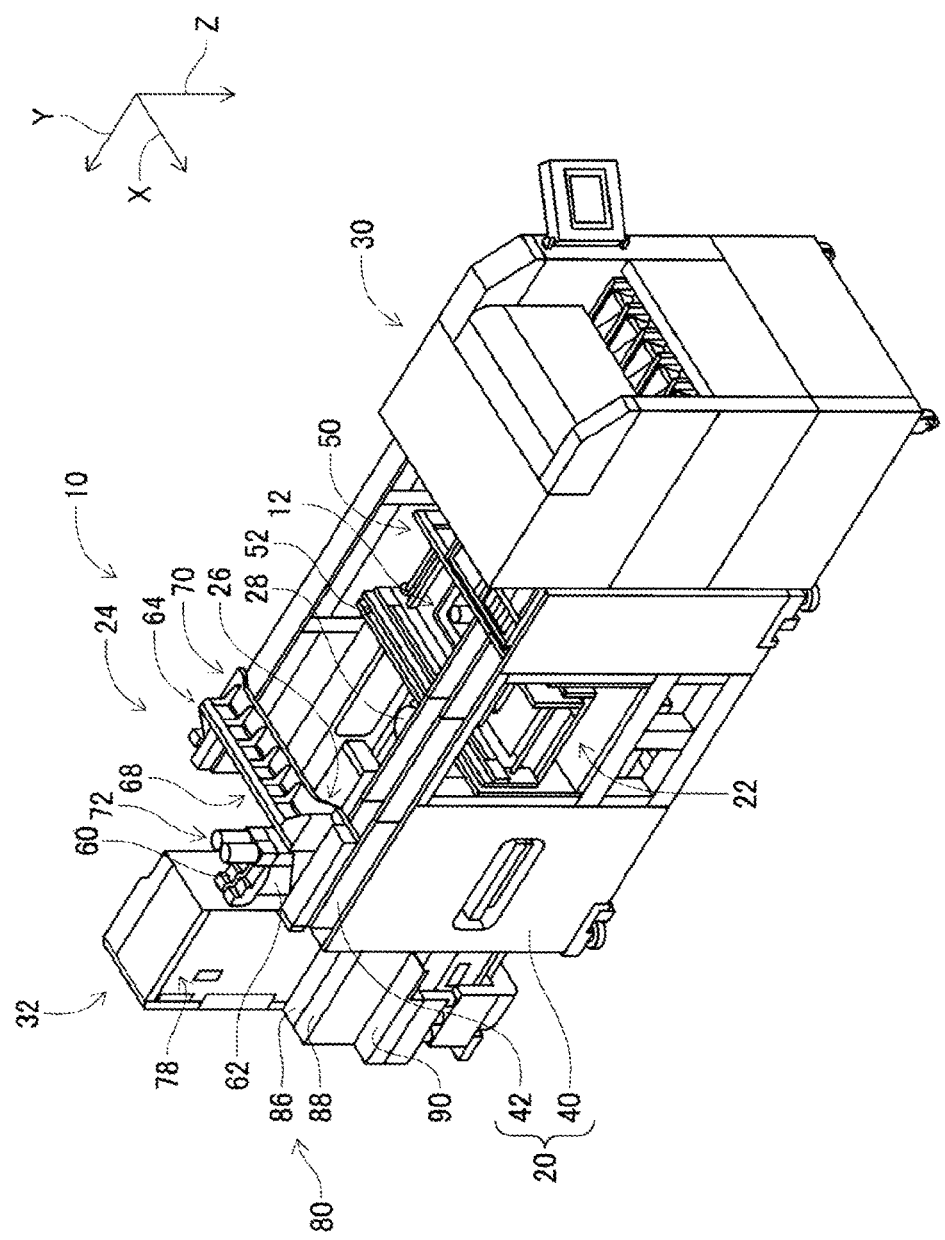
FIG. 1 is a perspective view illustrating a component mounter.

FIG. 1 illustrates component mounter 10. Component mounter 10 is a device for executing mounting work of a component on circuit substrate 12. Component mounter 10 includes device main body 20, substrate conveyance and holding device 22, component mounting device 24, mark camera 26, part camera 28, bulk component supply device 30, component supply device 32, and control device (refer to FIG. 3) 34. In addition, as circuit substrate 12, a circuit board, a substrate having a three-dimensional structure, and the like are exemplified, and as the circuit board, a printed wiring board, a printed circuit board, and the like are exemplified.

Device main body 20 is configured with frame section 40 and beam section 42 mounted on frame section 40. Substrate conveyance and holding device 22 is disposed at the center of frame section 40 in a front-rear direction, and includes conveyance device 50 and clamping device 52. Conveyance device 50 is a device for conveying circuit substrate 12, and clamping device 52 is a device for holding circuit substrate 12. Accordingly, substrate conveyance and holding device 22 conveys circuit substrate 12 and fixedly holds circuit substrate 12 at a predetermined position. In the following description, a conveyance direction of circuit substrate 12 is referred to as an X-direction, a horizontal direction perpendicular to the direction is referred to as a Y-direction, and a vertical direction is referred to as a Z-direction. In other words, a width direction of component mounter 10 is the X-direction, and the front-rear direction is the Y-direction.

Figure 2:
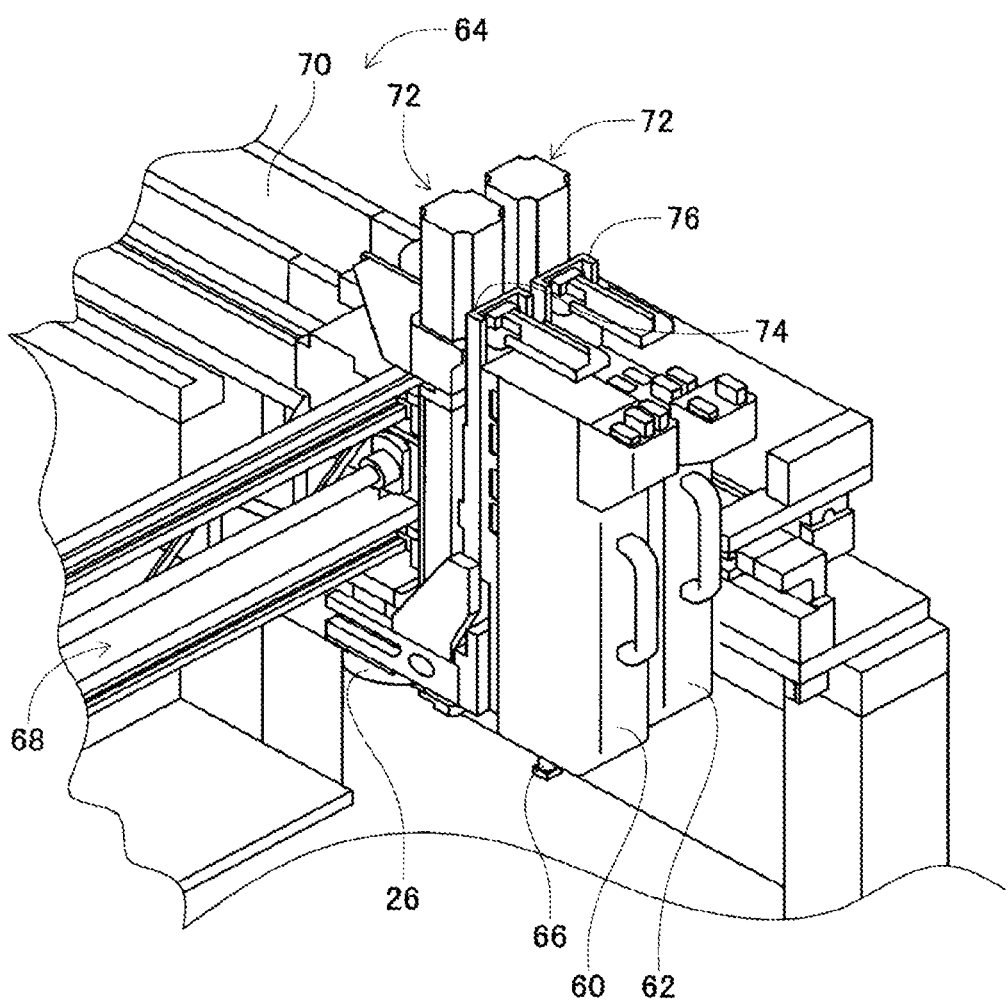
FIG. 2 is a perspective view illustrating a component mounting device.

Component mounting device 24 is disposed in beam section 42 and includes two work heads 60 and 62 and work head moving device 64. Component holding chuck 66 (refer to FIG. 2) is detachably provided on a lower end face of each of work heads 60 and 62. Component holding chuck 66 has one pair of holding claws (not illustrated) and holds the component by the pair of holding claws. In addition, work head moving device 64 includes X-direction moving device 68, Y-direction moving device 70, and Z-direction moving device 72. Further, two work heads 60 and 62 are integrally moved to any position on frame section 40 by X-direction moving device 68 and Y-direction moving device 70. In addition, as illustrated in FIG. 2, each of work heads 60 and 62 is detachably mounted on sliders 74 and 76, and Z-direction moving device 72 moves sliders 74 and 76 individually in the vertical direction. In other words, work heads 60 and 62 are individually moved in the vertical direction by Z-direction moving device 72.

Mark camera 26 is attached to slider 74 in a state of facing downward, and is moved in the X-direction and in the Y-direction together with work head 60. Accordingly, mark camera 26 images any position on frame section 40. Further, mark camera 26 is moved in the vertical direction in accordance with the movement of slider 74 in the Z-direction. Accordingly, the focus of mark camera 26 is adjusted. Further, as illustrated in FIG. 1, part camera 28 is disposed between substrate conveyance and holding device 22 and component supply device 32 on frame section 40 in a state of facing upward. Accordingly, part camera 28 images a component held by component holding chuck 66 of work heads 60 and 62.

Bulk component supply device 30 is disposed at one end portion of frame section 40 in the front-rear direction. Bulk component supply device 32 is a device for aligning multiple components in a state of being scattered and supplying the components in an aligned state. In other words, bulk component supply device 32 is a device for aligning the multiple components in any orientation in a predetermined orientation and supplying the components in the predetermined orientation.

Component supply device 32 is disposed at the other end portion of frame section 40 in the front-rear direction. Component supply device 30 includes tray-type component supply device 78 and feeder-type component supply device 80. Tray-type component supply device 78 is a device for supplying the component in a state of being placed on a tray. Feeder-type component supply device 80 is a device for supplying the component by tape feeders 86 and 88.

Tape feeder 86 is detachably mounted on tape feeder holding stand 90 fixedly provided at the other end portion of frame section 40. Tape feeder 86 is a device for detaching an axial component from taped components (refer to FIG. 4) 100 and supplying a lead wire of the detached axial component in a bent state.

Figure 4:
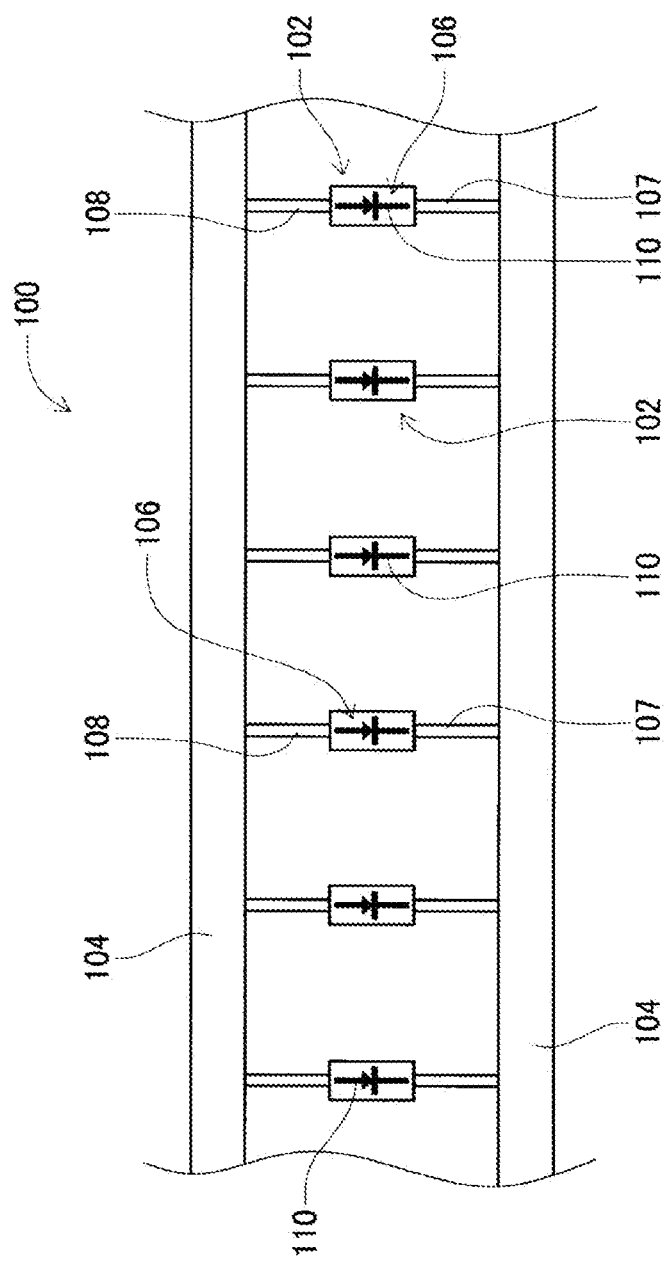
FIG. 4 is a plan view illustrating taped axial components.

As illustrated in FIG. 4, taped components 100 are configured with multiple axial components 102 and two carrier tapes 104. Axial component 102 includes generally cylindrical main body section 106 and two leads 107 and 108. Two leads 107 and 108 are generally straight, and are fixed to both end faces of main body section 106 coaxially with the axis of main body section 106. In addition, axial component 102 is taped into two carrier tapes 104 at the tip portions of two leads 107 and 108, that is, at the end portions opposite to main body section 106, in a state of being sandwiched between two carrier tapes 104.

In addition, identification mark 110 is written on the upper face side of main body section 106 of each axial component 102. Identification mark 110 is a mark for identifying the polarity of two leads 107 and 108, and the polarity of two leads 107 and 108 are identified by the direction in which the arrow in identification mark 110 is oriented. Specifically, lead 107 positioned in the direction in which the arrow in identification mark 110 is oriented is a cathode, that is, a negative electrode. Meanwhile, lead 108 positioned in a direction opposite to the direction in which the arrow in identification mark 110 is oriented is an anode, that is, a positive electrode.

Tape feeder 86 detaches axial component 102 from taped components 100 and supplies leads 107 and 108 of the detached axial component 102 in a bent state. Since tape feeder 86 has a known structure, when briefly describing, taped components 100 are provided to extend in the front-rear direction on an upper face of tape feeder 86. In addition, taped components 100 extend in a state where leads 107 and 108 of axial component 102 extend in a left-right direction.

Further, taped components 100 are fed toward a supply position by feeding device (refer to FIG. 3) 112, and at the supply position, leads 107 and 108 taped to carrier tape 104 are cut by cutting and bending device (refer to FIG. 3) 114. In addition, leads 107 and 108 separated from carrier tape 104 by the cutting are bent by cutting and bending device 114 generally at 90 degrees. Accordingly, tape feeder 86 detaches axial component 102 from taped components 100 and supplies leads 107 and 108 of detached axial component 102 in a bent state.

In addition, there is a case where taped components 100 are spliced for the purpose of replenishing a component or the like. Splicing is the joining of two taped components 100 at each end with a splicing tape. Therefore, detection sensor (refer to FIG. 3) 116 is provided in tape feeder 86, and a splicing point, that is, a joint of two taped components 100 joined to each other with the splicing tape, is detected by detection sensor 116.

In addition, similar to tape feeder 86, tape feeder 88 is also detachably mounted on tape feeder holding stand 90. Tape feeder 88 is a device for detaching a radial component from taped components (refer to FIG. 5) 120 and supplying the detached radial component.

Figure 5:
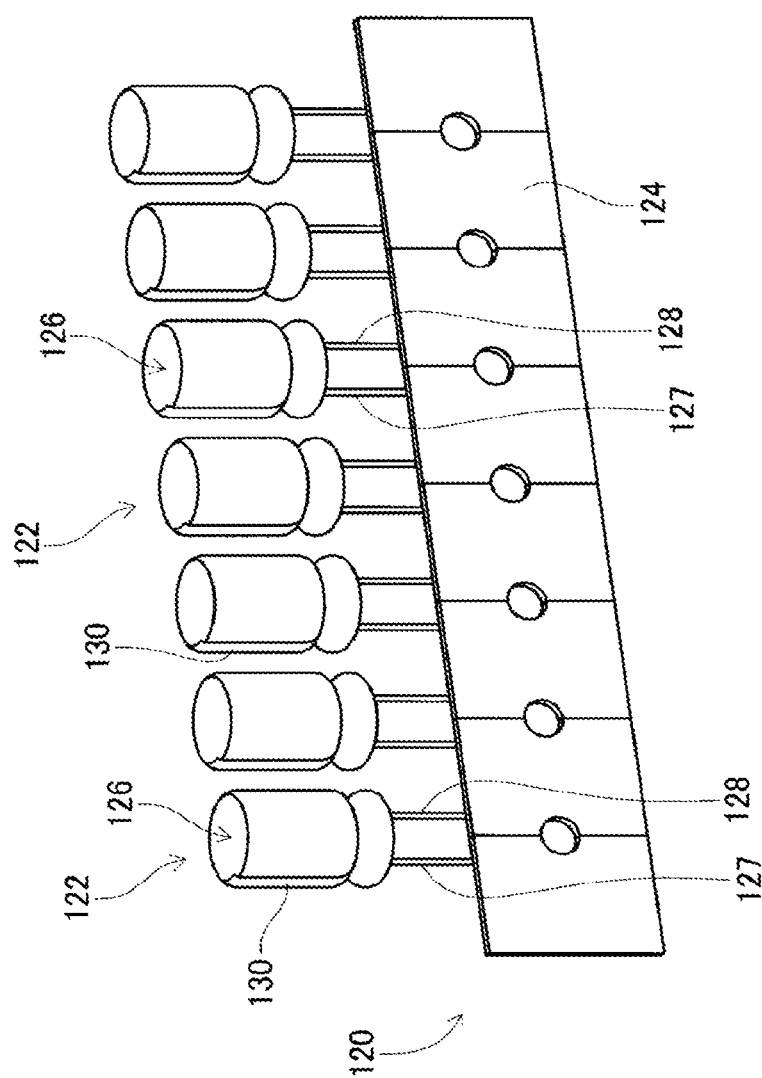
FIG. 5 is a perspective view illustrating taped radial components.

As illustrated in FIG. 5, taped components 120 are configured with multiple radial components 122 and carrier tape 124. Radial component 122 includes generally cylindrical main body section 126 and two leads 127 and 128. Two leads 127 and 128 are generally straight and extend from one end face of the main body section 126 in parallel with an axial direction of main body section 126. In addition, carrier tape 124 is taped at the tip portions of the two leads 127 and 128, that is, at the end portions opposite to main body section 126.

In addition, identification mark 130 is written on a side face of main body section 126 of each radial component 122. Identification mark 130 is a mark for identifying the polarity of two leads 127 and 128, and indicates that the lead positioned in the vicinity of identification mark 130 is a cathode. Therefore, lead 127 positioned below identification mark 130 is a cathode, and lead 128 different from lead 127 is an anode. In addition, although identification mark 130 is written to extend in the vertical direction on the side face of main body section 126 of radial component 122, the upper end portion of identification mark 130 slightly extends to the upper face side of main body section 126. In other words, identification mark 130 extends in the vertical direction of the side face of main body section 126 and is written to reach the upper face side of main body section 126.

Tape feeder 88 detaches radial component 122 from taped components 120 and feeds the detached radial component 122. Since tape feeder 88 has a known structure, when briefly describing, tape feeder 88 is provided such that taped components 120 extend in the front-rear direction on an upper face of tape feeder 88. In addition, taped components 120 extend in a state where leads 127 and 128 of radial component 122 extend in the vertical direction.

Further, taped components 120 are fed toward a supply position by feeding device (refer to FIG. 3) 132, and at the supply position, leads 127 and 128 taped to carrier tape 124 are cut by cutting device (refer to FIG. 3) 134. Accordingly, tape feeder 88 detaches radial component 122 from taped components 120 and supplies detached radial component 122.

In addition, similar to taped components 100, there is a case where taped components 120 are also spliced. Therefore, tape feeder 88 is also provided with detection sensor (refer to FIG. 3) 136, and the splicing point, that is, the joint of two taped components 120 joined to each other with the splicing tape is detected by detection sensor 136.

Figure 3:
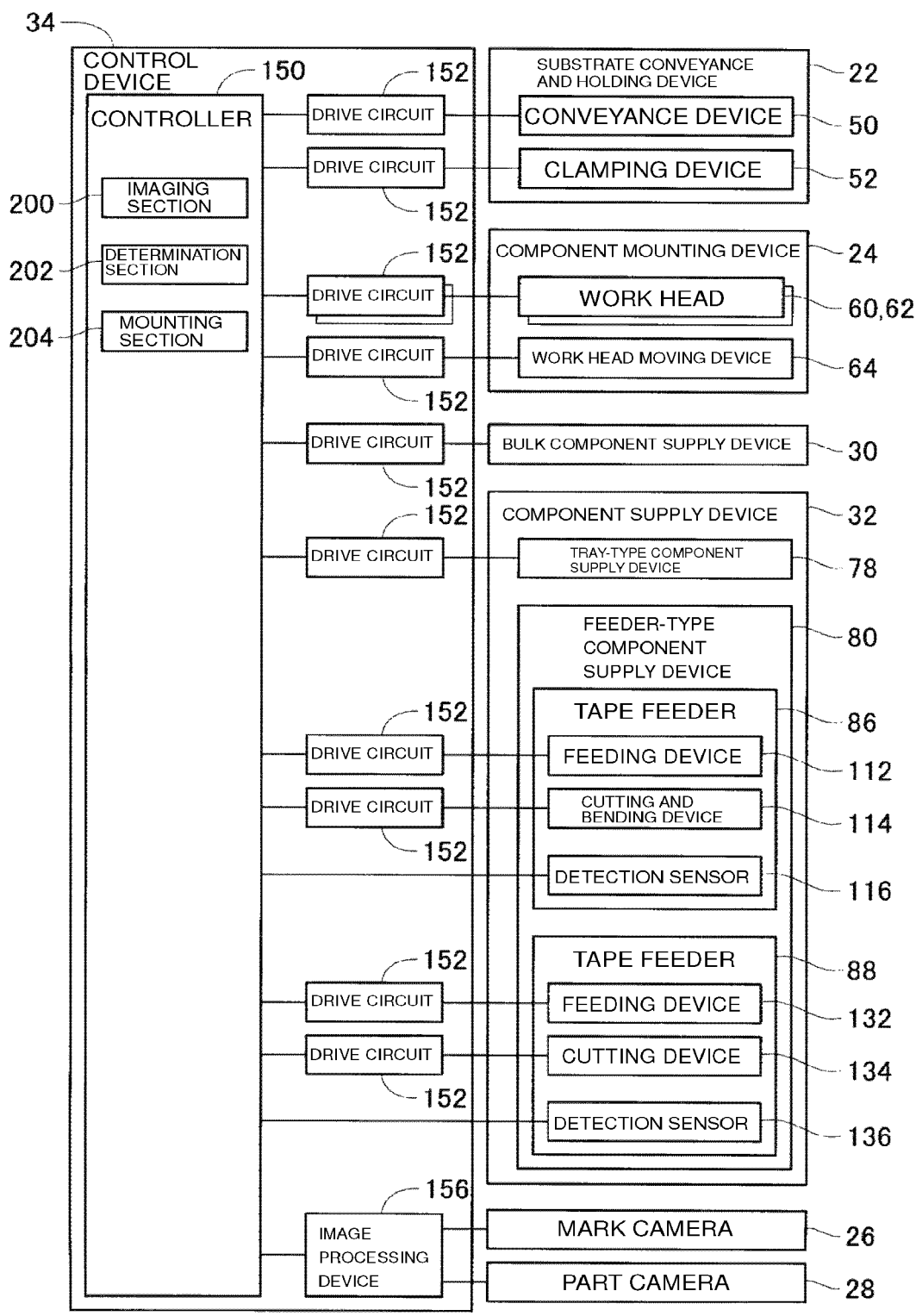
FIG. 3 is a block diagram illustrating a control device.

In addition, as illustrated in FIG. 3, control device 34 includes controller 150, multiple drive circuits 152, and image processing device 156. Multiple drive circuits 152 are connected to conveyance device 50, clamping device 52, work heads 60 and 62, work head moving device 64, bulk component supply device 30, tray-type component supply device 78, feed device 112, cutting and bending device 114, feeding device 132, and cutting device 134. Controller 150 includes CPU, ROM, RAM, and the like, mainly includes a computer, and is connected to multiple drive circuits 152. Accordingly, the operations of substrate conveyance and holding device 22, component mounting device 24, and the like are controlled by controller 150. Further, controller 150 is also connected to detection sensors 116 and 136. Accordingly, the values detected by detection sensors 116 and 136 are input into controller 150, and controller 150 specifies the splicing points in taped components 100 and 120. Furthermore, controller 150 is also connected to image processing device 156. Image processing device 156 processes image data obtained by mark camera 26 and part camera 28, and controller 150 acquires various types of information from the image data.

(B) Operation of Component Mounter

In component mounter 10, the mounting work of the component is performed on circuit substrate 12 held by substrate conveyance and holding device 22 with the above-described configuration. In component mounter 10, various components can be mounted on circuit substrate 12, but a case where axial component 102 supplied by tape feeder 86 or radial component 122 supplied by tape feeder 88 is mounted on circuit substrate 12 will be described below. In addition, in a case where axial component 102 and radial component 122 are not distinguished from each other, there is a case where axial component 102 and radial component 122 are collectively referred to as a lead component.

Specifically, circuit substrate 12 is conveyed to a work position, and is fixedly held by clamping device 52 at the position. Next, mark camera 26 moves above circuit substrate 12 and images circuit substrate 12. Accordingly, information on a holding position of circuit substrate 12 and the like can be obtained. In addition, tape feeder 86 or tape feeder 88 supplies the lead component at a predetermined supply position. Further, either of work heads 60 and 62 moves above the supply position of the component, and component holding chuck 66 holds the lead component.

Figure 6:
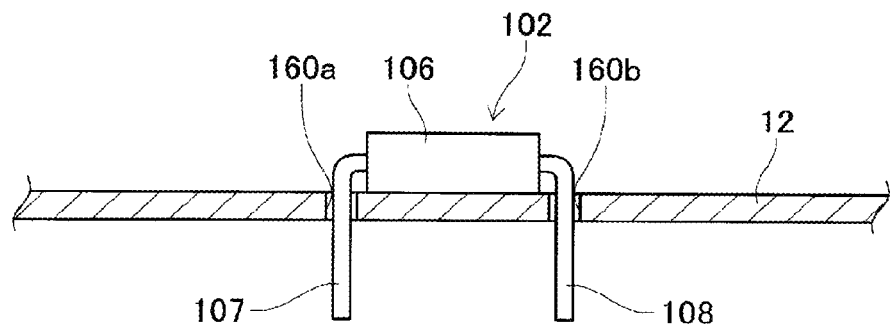
FIG. 6 is a schematic diagram illustrating an axial component in a state of being mounted onto a circuit substrate.
Figure 7:
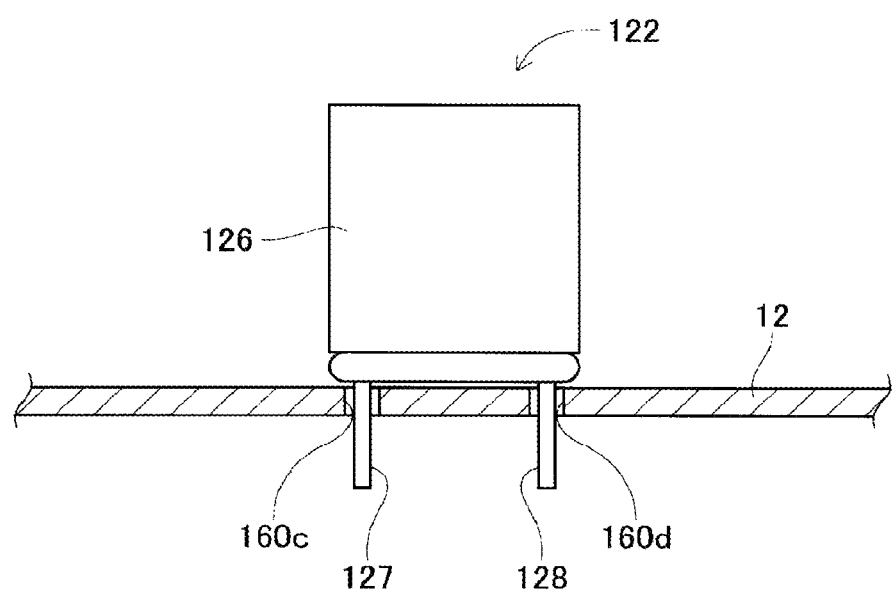
FIG. 7 is a schematic diagram illustrating a radial component in a state of being mounted onto a circuit substrate.

Subsequently, work heads 60 and 62 that hold the lead components move above part camera 28, and part camera 28 images the lead components held by component holding chuck 66. Accordingly, information on the holding position of the component and the like can be obtained. Subsequently, work heads 60 and 62 that hold the lead components move above circuit substrate 12 and correct errors of the holding position of circuit substrate 12, errors of the holding position of the components, and the like. In addition, in a case where axial component 102 is held by component holding chuck 66, as illustrated in FIG. 6, leads 107 and 108 of axial component 102 are inserted into through holes 160 formed on circuit substrate 12. Further, in a case where radial component 122 is held by component holding chuck 66, as illustrated in FIG. 7, leads 127 and 128 of radial component 122 are inserted into through holes 160 formed on circuit substrate 12.

(C) Mounting Work in Consideration of Polarity Disposition of Leads

In component mounter 10, the lead component is mounted on circuit substrate 12 according to the above-described procedure. However, since leads 107 and 108 and the like of the lead component have the polarities as described above, a mounting angle of the lead component is set in advance in consideration of the polarity disposition of leads 107 and 108 and the like. In other words, the direction of polarities of the leads when mounting the lead component is set in advance, and through hole 160 into which the lead is inserted is determined for each polarity. Specifically, for example, as illustrated in FIG. 6, the mounting angle of axial component 102 is set in advance such that cathode lead 107 of axial component 102 is inserted into through hole 160a and anode lead 108 is inserted into through hole 160b. Further, for example, as illustrated in FIG. 7, the mounting angle of radial component 122 is set in advance such that cathode lead 127 of radial component 122 is inserted into through hole 160c and anode lead 128 is inserted into through hole 160d. In addition, there is a case where the mounting angle of axial component 102 or radial component 122, that is, the lead component, which is set in advance, is referred to as a set mounting angle.

In this manner, the set mounting angle is set for the lead component mounted on circuit substrate 12, the lead component is mounted on circuit substrate 12 at the set mounting angle, and accordingly, the lead component exhibits an appropriate function. However, there is a case where the polarity disposition of the leads of the lead component when the lead component is supplied from tape feeders 86 and 88 (hereinafter, there is a case of being referred to as "actual polarity disposition") is different from the polarity disposition of the leads of the lead component, set in advance (hereinafter, there is a case of being referred to as "set polarity disposition"). In such a case, the lead component is mounted on circuit substrate 12 at an angle different from the set angle, and the lead component cannot exhibit an appropriate function.

Figure 8:
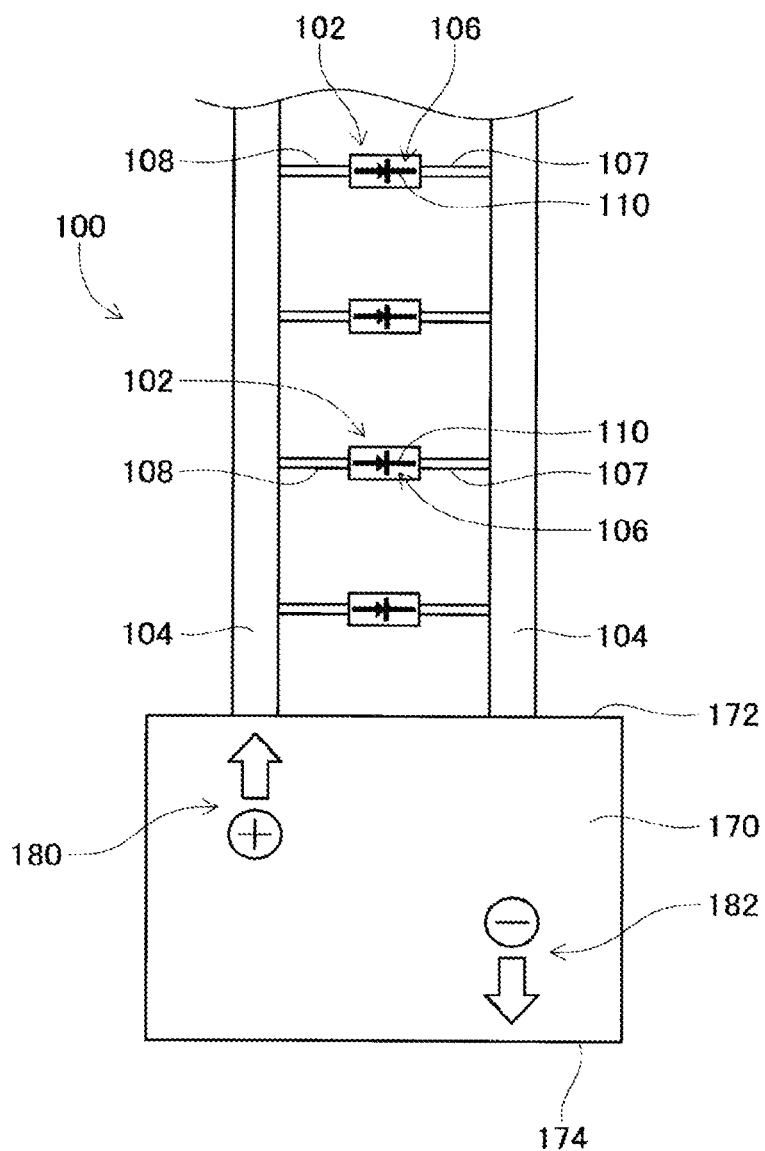
FIG. 8 is a schematic diagram illustrating axial components in a state of being pulled out from a box.

Specifically, for example, taped components 100 of axial component 102 is accommodated in box 170 illustrated in FIG. 8. One pair of opposing side faces 172 and 174 of box 170 are openable, any one of the pair of side faces is opened, and accordingly, taped components 100 are pulled out from one of the pair of side faces. In addition, arrow 180 is written on the upper face of box 170 so as to face the left side of side face 172 in FIG. 8, and arrow 180 is marked with a symbol indicating an anode. In addition, arrow 182 is written on the upper face of box 170 so as to face the left side of side face 174 in FIG. 9, and arrow 182 is marked with a symbol indicating a cathode. Therefore, by checking arrows 180 and 182 and opening any of one pair of side faces 172 and 174, an operator can pull out taped components 100 from box 170 in the polarity disposition of predetermined leads 107 and 108.

Figure 9:
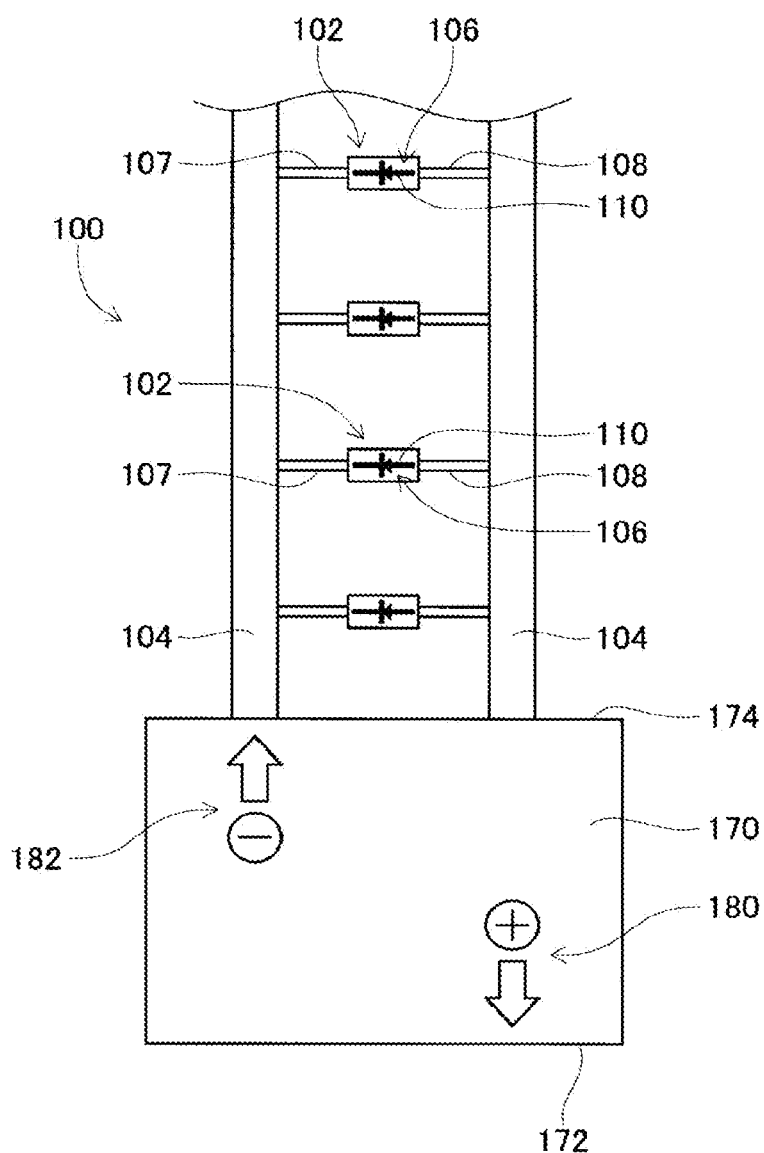
FIG. 9 is a schematic diagram illustrating axial components in a state of being pulled out from a box.

In other words, as illustrated in FIG. 8, in a case where side face 172 is opened, taped components 100 are pulled out from side face 172 in a state where cathode lead 107 is positioned on the right side in FIG. 8 and anode lead 108 is positioned on the left side in FIG. 8. In the example in FIG. 8, anode lead 108 is positioned in the direction of arrow 180 indicating the anode. In addition, as illustrated in FIG. 9, in a case where the side face 174 is opened, taped components 100 are pulled out from side face 174 in a state where anode lead 108 is positioned on the right side in FIG. 9 and cathode lead 107 is positioned on the left side in FIG. 9. In the example of FIG. 9, cathode lead 107 is positioned in the direction of arrow 182 indicating the cathode.

In this manner, by checking arrows 180 and 182 and opening any of one pair of side faces 172 and 174, the operator can pull out taped components 100 from box 170 in the polarity disposition of predetermined leads 107 and 108. Therefore, the operator checks arrows 180 and 182 and pulls out taped components 100 from any of one pair of side faces 172 and 174 such that taped components 100 can extend to tape feeder 86 in the set polarity disposition. However, there is a case where taped components 100 extend to tape feeder 86 in the polarity disposition different from the set polarity disposition due to a mistake or the like by the operator. In other words, in order to extend taped components 100 to tape feeder 86 in the set polarity disposition, there is a case where taped components 100 pulled out from side face 174 extend to tape feeder 86 when taped components 100 need to be pulled out from side face 172 of box 170.

In such a case, the actual polarity disposition in tape feeder 86 is different from the set polarity disposition, and the set polarity disposition becomes a disposition in which cathode lead 107 and anode lead 108 are switched with each other. Therefore, when axial component 102 supplied by tape feeder 86 is mounted on circuit substrate 12 at the set mounting angle, axial component 102 is mounted on circuit substrate 12 in a state where cathode lead 107 and anode lead 108 are switched with each other.

In other words, in a case where taped components 100 extend to tape feeder 86 in the set polarity disposition, as illustrated in FIG. 6, the cathode lead 107 of axial component 102 is inserted into through hole 160a, and anode lead 108 is inserted into through hole 160b. Meanwhile, in a case where taped components 100 extend to tape feeder 86 in a polarity disposition different from the set polarity disposition, cathode lead 107 of axial component 102 is inserted into through hole 160b, and anode lead 108 is inserted into through hole 160a. In this manner, when axial component 102 is mounted on circuit substrate 12 in a state where the polarities of the leads are opposite to each other, axial component 102 cannot exhibit an appropriate function.

In view of this, in component mounter 10, in taped components 100 extended to tape feeder 86, identification mark 110 written on axial component 102 is imaged, and it is determined whether the actual polarity disposition and the set polarity disposition match each other based on the image data. In addition, in a case where the actual polarity disposition and the set polarity disposition match each other, axial component 102 supplied by tape feeder 86 is mounted on circuit substrate 12 at the set mounting angle. Meanwhile, in a case where the actual polarity disposition and the set polarity disposition do not match each other, axial component 102 supplied by tape feeder 86 is mounted on circuit substrate 12 at amounting angle increased or decreased by 180 degrees from the set mounting angle, that is, at a mounting angle rotated by 180 degrees from the set mounting angle.

Specifically, at a predetermined timing, mark camera 26 is moved above the supply position of tape feeder 86, and identification mark 110 of axial component 102 that is moving to the supply position is imaged. In addition, mark camera 26 images axial component 102 at the supply position before leads 107 and 108 are cut and bent by cutting and bending device 114 of tape feeder 86. This is because there is a case where main body section 106 of axial component 102 rotates along the cutting and bending of leads 107 and 108, and when main body section 106 rotates, there is a concern that identification mark 110 written on main body section 106 cannot be imaged by mark camera 26.

When identification mark 110 is imaged by mark camera 26, the image data is output to controller 150 and analyzed by controller 150. Accordingly, the actual polarity disposition in tape feeder 86 is specified. In addition, controller 150 determines whether the actual polarity disposition and the set polarity disposition match each other. At this time, in a case where the actual polarity disposition and the set polarity disposition match each other, controller 150 outputs a command for mounting axial component 102 supplied by tape feeder 86 onto circuit substrate 12 at the set mounting angle, to component mounting device 24. Meanwhile, in a case where the actual polarity disposition and the set polarity disposition do not match each other, controller 150 outputs a command for mounting axial component 102, which is supplied by tape feeder 86 onto circuit substrate 12 at the mounting angle rotated by 180 degrees from the set mounting angle, to component mounting device 24. Incidentally, it is needless to say that 180 degrees used here is an angle of difference between the actual polarity disposition and the set polarity disposition.

In addition, component mounting device 24 that has received the command from controller 150 executes the mounting work in accordance with the command. Accordingly, even in a case where the actual polarity disposition in tape feeder 86 is different from the set polarity disposition, axial component 102 can be mounted on circuit substrate 12 in a state where the polarity is correct. In addition, after it is determined once whether the actual polarity disposition and the set polarity disposition match each other, axial components 102 having the same polarity disposition are sequentially supplied from tape feeder 86. Therefore, until tape feeder 86 is exchanged and taped components 100 are exchanged, controller 150 outputs the command in accordance with the first determination.

In other words, in the first determination, in a case where the actual polarity disposition and the set polarity disposition match each other, the command for mounting axial component 102 onto circuit substrate 12 at the set mounting angle is output until tape feeder 86 is exchanged and taped components 100 are exchanged. Meanwhile, in the first determination, in a case where the actual polarity disposition and the set polarity disposition do not match each other, the command for mounting axial component 102 onto circuit substrate 12 at the mounting angle rotated by 180 degrees from the set mounting angle is output until tape feeder 86 is exchanged and taped components 100 are exchanged.

Therefore, after tape feeder 86 is exchanged and taped components 100 are exchanged, identification mark 110 of axial component 102 is imaged by mark camera 26 at the supply position again. In addition, it is determined whether the actual polarity disposition and the set polarity disposition match each other based on the image data. In addition, the imaging of identification mark 110 at the supply position and the determination of matching between the actual polarity disposition and the set polarity disposition can be executed not only after tape feeder 86 is exchanged and taped component 100 are exchanged, but also at various timings such as the timing at which component mounter 10 is started and the timing at which an error occurs.

In addition, in tape feeder 86, for the purpose of replenishing the components, there is a case where the taped components of the same type as taped components 100 are spliced to taped components 100 set in tape feeder 86. Even in this case, the imaging of identification mark 110 at the supply position and the determination of the matching between the actual polarity disposition and the set polarity disposition are executed.

Specifically, as described above, tape feeder 86 is provided with detection sensor 116, and the splicing point is detected by detection sensor 116. In addition, the detection result of detection sensor 116 is input into controller 150. In this case, when the splicing point is input into controller 150, controller 150 images, on the downstream side of the splicing point, identification mark 110 written on axial component 102 with mark camera 26 at the timing when axial component 102 positioned to be the closest to the splicing point is moved to the supply position. In addition, controller 150 executes the determination of the matching between the actual polarity disposition and the set polarity disposition based on the image data and outputs the command according to the determination to component mounting device 24. Accordingly, even in a case where the operator mistakenly splices the polarity of the lead, it becomes possible to mount axial component 102 supplied from the taped components after the splicing onto circuit substrate 12 in a state where the polarity is correct.

In addition, similar to the case in which when axial component 102 is supplied by tape feeder 86, even when radial component 122 is supplied by tape feeder 88, the imaging of identification mark 130 and the determination of the matching between the actual polarity disposition and the set polarity disposition are executed, and the command according to the determination is output to component mounting device 24. Since a technique such as the imaging of identification mark 130 when radial component 122 is supplied is substantially the same as the technique such as the imaging of identification mark 130 when radial component 122 is supplied, the description thereof will be omitted.

However, as described above, identification mark 130 imaged when radial component 122 is supplied extends to the upper face side of main body section 126 of radial component 122. Therefore, mark camera 26 images identification mark 130 written on the upper face side of main body section 126. Meanwhile, identification mark 110 imaged when axial component 102 is supplied is written on the upper face side of main body section 106 of axial component 102. Here, when comparing the height of the upper face of main body section 106 of axial component 102 with the height of the upper face of main body section 126 of radial component 122, as illustrated in FIGS. 6 and 7, the height of the upper face of main body section 106 of axial component 102 and the height of the upper face of main body section 126 of radial component 122 are greatly different from each other. Therefore, when identification mark 110 is imaged and when identification mark 130 is imaged, mark camera is moved in the vertical direction to perform focus adjustment. As a result, it becomes possible to appropriately image identification marks 110 and 130.

In addition, as illustrated in FIG. 3, controller 150 includes imaging section 200, determination section 202, and mounting section 204. Imaging section 200 is a functional section for imaging identification marks 110 and 130 by mark camera 26. Determination section 202 is a functional section for determining whether the actual polarity disposition and the set polarity disposition match each other based on the image data. Mounting section 204 is a functional section for outputting the command to component mounting device 24 in accordance with the result of the determination of the matching between the actual polarity disposition and the set polarity disposition, and causing the component mounting device 24 to execute the mounting work.

Incidentally, component mounter 10 is an example of a work machine. Circuit substrate 12 is an example of a board. Mark camera 26 is an example of an imaging device. Control device 34 is an example of a control device. Work heads 60 and 62 are examples of mounting heads. Tape feeders 86 and 88 are examples of tape feeders. Taped components 100 and 120 are examples of the taped components. Axial component 102 is an example of a lead component. Leads 107, 108, 127, and 128 are examples of leads. Identification marks 110 and 130 are examples of identification objects. Detection sensor 116 is an example of a detection device. Radial component 122 is an example of a lead component. Detection sensor 136 is an example of a detection device. Imaging section 200 is an example of an imaging section. Determination section 202 is an example of a determination section. Mounting section 204 is an example of a mounting section. In addition, a process executed by imaging section 200 is an example of an imaging process. A process executed by determination section 202 is an example of a determining process. The process executed by mounting section 204 is an example of a mounting process.

In addition, the present disclosure is not limited to the above-described embodiment, and can be implemented in various modes in which various changes and improvements are made based on the knowledge of a person skilled in the art. Specifically, for example, in the above-described embodiment, in a case where the actual polarity disposition and the set polarity disposition do not match each other, although the set mounting angle is changed and the mounting work is executed, the operator may be notified that the actual polarity disposition and the set polarity disposition do not match each other without executing the mounting work.

In addition, in the above-described embodiment, although identification marks 110 and 130 are used as the identification objects that make it possible to identify the polarity of the leads, the identification objects are not limited to identification marks 110 and 130, and any identification objects that can identify the polarity of the leads, such as various symbols and notches, may be used.

In addition, in the above-described embodiment, although identification marks 110 and 130 are imaged at the supply position, the imaging position is not limited as long as identification marks 110 and 130 are exposed.

Further, in the above-described embodiment, although the splicing points are detected by detection sensors 116 and 136, it is possible to specify the splicing points by other techniques. For example, the number of lead components supplied by tape feeders 86 and 88 can be counted. In addition, in a case where the counter number reaches a set number (the number of lead components of taped components 100 and 120 in a case where no splicing is performed), it is possible to specify the splicing point between the lead components that have reached the set number and the lead components that exist on the downstream side of the lead components.

REFERENCE SIGNS LIST

10: component mounter (work machine), 12: circuit substrate (board), 26: mark camera (imaging device), 34: control device, 60: work head (mounting head), 62: work head (mounting head), 86: tape feeder, 88: tape feeder, 100: taped components, 102: axial component (lead component), 107: lead, 108: lead, 110: identification mark (identification object), 116: detection sensor (detection device), 120: taped components, 122: radial component (lead component), 127: lead, 128: lead, 130: identification mark (identification object), 136: detection sensor (detection device), 200: imaging section (imaging process), 202: determination section (determining process), 204: mounting section (mounting process)

The invention claimed is:

1. A work machine comprising:
   a tape feeder provided with taped lead components having multiple leads in an extended manner, the tape feeder configured to supply the taped lead components;
   a mounting head configured to mount the lead components supplied by the tape feeder onto a board by inserting the multiple leads into through holes provided on the board;
   an imaging device; and
   a control device,
   wherein the control device includes:
   an imaging section configured to image an identification object of the taped lead components fed by the tape feeder with the imaging device, the identification object being provided on each of the taped lead components fed by the tape feeder and capable of identifying the polarity of each of the multiple leads of each of the taped lead components,
   a determination section configured to
      determine an actual polarity disposition, which is the polarity disposition of each of the multiple leads in the taped lead components fed by the tape feeder, based on image data of the identification object obtained by the imaging section imaging the identification object with the imaging device, and
      determine whether the actual polarity disposition matches a set polarity disposition, which is the polarity disposition of each of the multiple leads of the taped lead components fed by the tape feeder set in advance, and
   a mounting section configured to
      mount the lead components, with the mounting head, by inserting the multiple leads of the lead components into the through holes of the board with a set mounting angle, which is a mounting angle set in advance, when the determination section determines that the actual polarity disposition and the set polarity disposition match each other, and
      mount the lead components, with the mounting head, by inserting the multiple leads of the lead components into the through holes of the board with a mounting angle rotated 180 degrees from the set mounting angle when the determination section determines that the actual polarity disposition and the set polarity disposition do not match each other.

2. The work machine according to claim 1, further comprising a detection device configured to detect a splicing point of the taped lead components fed by the tape feeder, wherein the imaging section images the identification object of one of the taped lead components positioned closest to the splicing point with the imaging device downstream from the splicing point detected by the detection device.

3. A mounting method for mounting lead components onto a board in a work machine including a tape feeder provided with taped lead components including lead components having multiple leads in an extended manner, the tape feeder configured to supply the taped lead components; a mounting head configured to mount the lead components supplied by the tape feeder onto a board by inserting the multiple leads into through holes provided on the board; and an imaging device; the mounting method comprising:
   imaging an identification object of the taped lead components fed by the tape feeder with the imaging device, the identification object being provided on each of the taped lead components fed by the tape feeder and capable of identifying the polarity of each of the multiple leads of each of the taped lead components;
   determining an actual polarity disposition, which is the polarity disposition of each of the multiple leads in the taped lead components fed by the tape feeder, based on image data of the identification object obtained by the imaging device;
   determining whether the actual polarity disposition matches a set polarity disposition, which is the polarity disposition of each of the multiple leads of the taped lead component fed by the tape feeder set in advance,
   mounting the lead components, with the mounting head, by inserting the multiple leads of the lead components into the through holes of the board with a set mounting angle, which is a mounting angle set in advance when it is determined that the actual polarity disposition and the set polarity disposition match each other; and
   mounting the lead components, with the mounting head, by inserting the multiple leads of the lead components into the through holes of the board with a mounting angle rotated 180 degrees from the set mounting angle when it is determined that the actual polarity disposition and the set polarity disposition do not match each other.

* * * * *